United States Patent
Bender et al.

(10) Patent No.: US 10,031,409 B2
(45) Date of Patent: Jul. 24, 2018

(54) REFLECTIVE PHOTOMASK AND REFLECTION-TYPE MASK BLANK

(71) Applicants: Markus Bender, Dresden (DE); Thorsten Schedel, Dresden (DE)

(72) Inventors: Markus Bender, Dresden (DE); Thorsten Schedel, Dresden (DE)

(73) Assignee: ADVANCED MASK TECHNOLOGY CENTER GmbH & CO. KG (DE)

( * ) Notice: Subject to any disclaimer, the term of this patent is extended or adjusted under 35 U.S.C. 154(b) by 69 days.

(21) Appl. No.: 15/179,775

(22) Filed: Jun. 10, 2016

(65) Prior Publication Data
US 2017/0108766 A1    Apr. 20, 2017

(30) Foreign Application Priority Data

May 29, 2015    (DE) ................. 10 2015 108 569

(51) Int. Cl.
G03F 1/24 (2012.01)
G03F 1/22 (2012.01)
G03F 1/38 (2012.01)

(52) U.S. Cl.
CPC . G03F 1/24 (2013.01); G03F 1/38 (2013.01)

(58) Field of Classification Search
None
See application file for complete search history.

(56) References Cited

U.S. PATENT DOCUMENTS

| 2007/0224522 A1 | 9/2007 | Lee et al. |
| 2007/0238033 A1 | 10/2007 | Kanayama et al. |
| 2008/0032206 A1 | 2/2008 | Lee et al. |
| 2009/0233188 A1 | 9/2009 | Amano et al. |
| 2011/0059391 A1 | 3/2011 | Shoki |
| 2011/0255065 A1 | 10/2011 | Oshemkov et al. |
| 2013/0323626 A1 | 12/2013 | Chang |

(Continued)

FOREIGN PATENT DOCUMENTS

| CN | 101073142 A | 11/2007 |
| CN | 103454849 A | 12/2013 |

(Continued)

OTHER PUBLICATIONS

Korean Office Action for Application No. 10-2016-0065936 dated Apr. 6, 2017.

(Continued)

*Primary Examiner* — Stephen Rosasco
(74) *Attorney, Agent, or Firm* — Tarolli, Sundheim, Covell & Tummino LLP

(57) ABSTRACT

A reflective photomask includes a substrate with a substrate layer of a low thermal expansion material. The substrate layer includes a main portion of a first structural configuration and an auxiliary portion of a second structural configuration of the low thermal expansion material. The auxiliary portion is formed in a frame section surrounding a pattern section of the substrate. A multilayer mirror is formed on a first surface of the substrate. A reflectivity of the multilayer mirror is at least 50% at an exposure wavelength below 15 nm. A frame trench extending through the multilayer mirror exposes the substrate in the frame section. The auxiliary portion may include scatter centers for out-of-band radiation.

24 Claims, 11 Drawing Sheets

(56) References Cited

U.S. PATENT DOCUMENTS

2014/0272674 A1   9/2014   Ni et al.
2014/0272678 A1   9/2014   Shih et al.
2015/0037714 A1*  2/2015   Cai ........................... G03F 1/38
                                                          430/5

FOREIGN PATENT DOCUMENTS

| JP | 5559948 B2    | 7/2014 |
| JP | 2015-050242 A | 3/2015 |
| TW | 201435475 A   | 9/2014 |
| TW | 201435481 A   | 9/2014 |

OTHER PUBLICATIONS

Office Action for Application No. TW 105116022 dated Mar. 8, 2017.

* cited by examiner

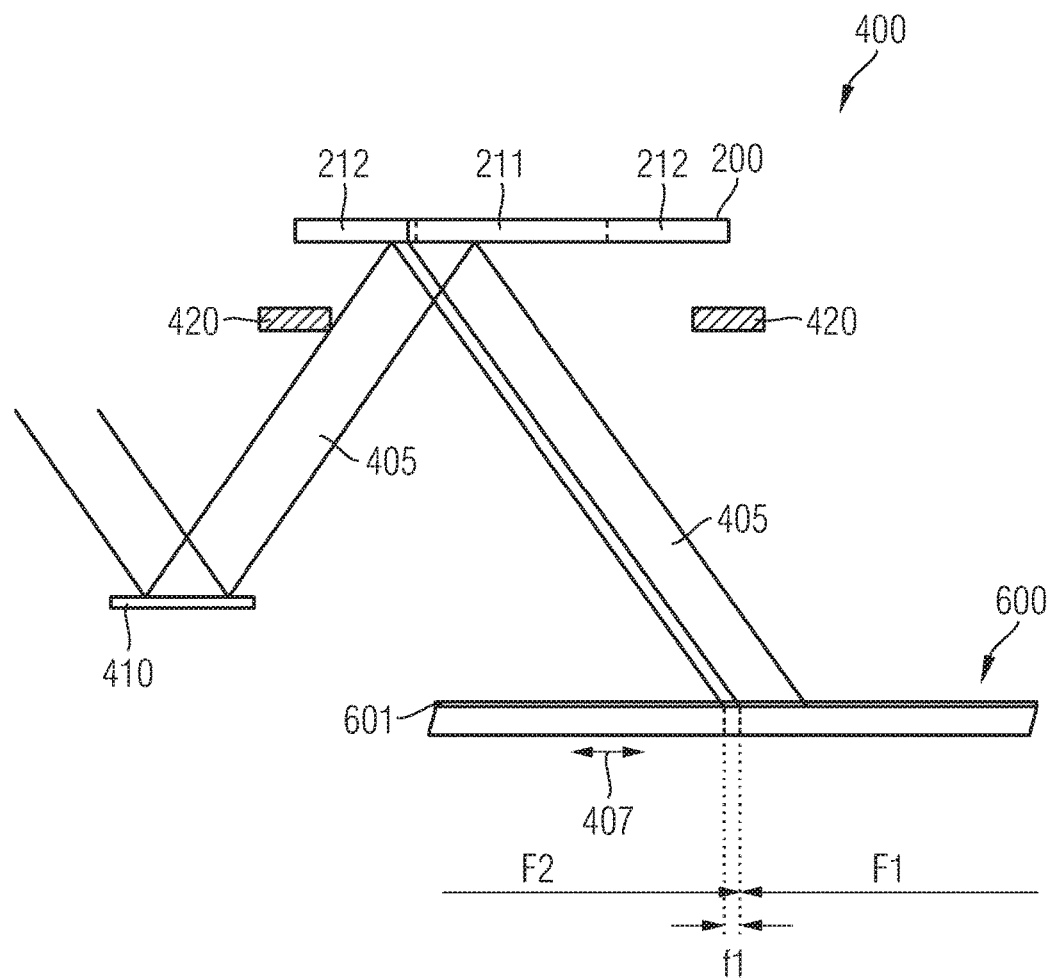

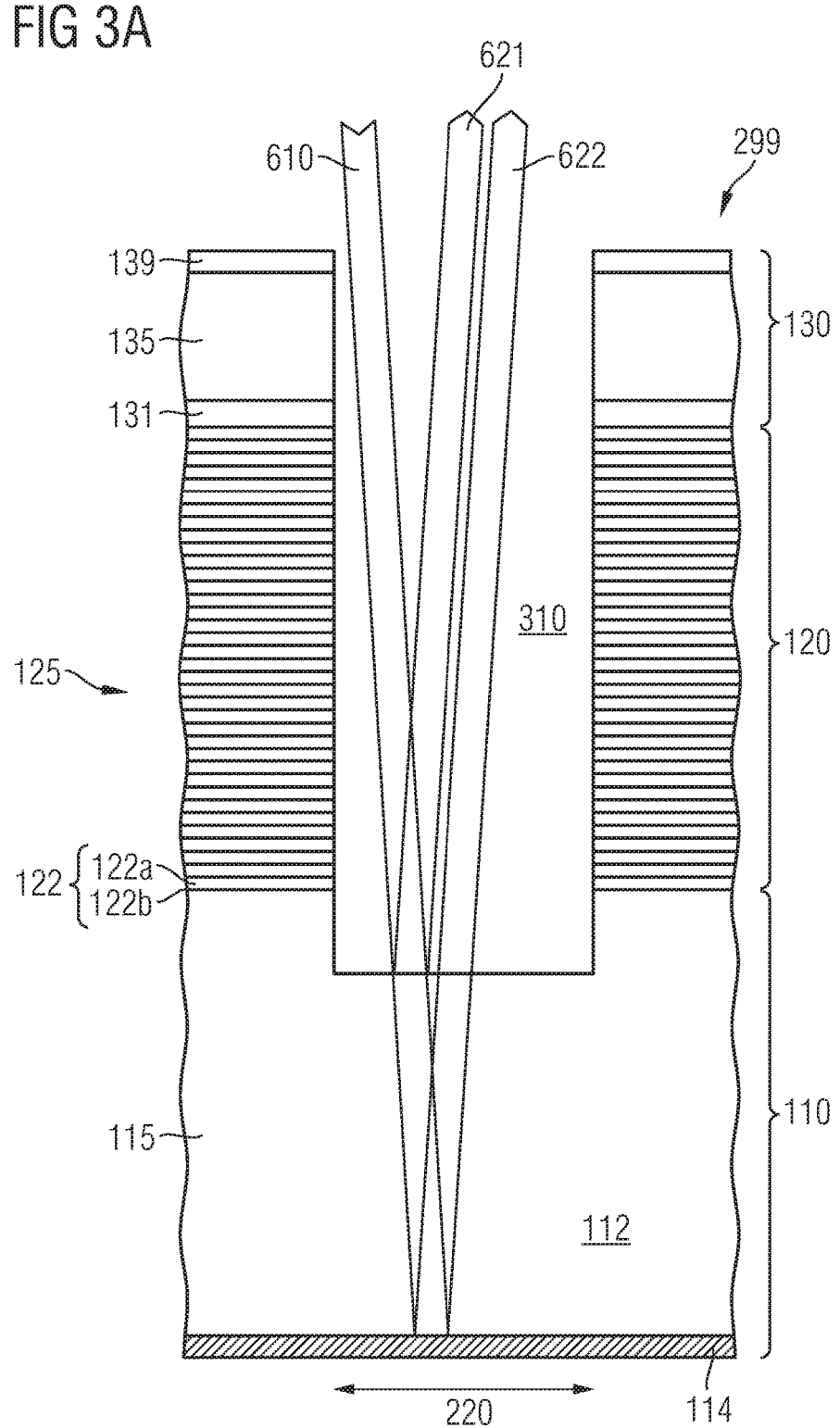

REFLECTIVE PHOTOMASK AND REFLECTION-TYPE MASK BLANK

BACKGROUND

Extreme Ultraviolet Lithography (EUVL) typically employs light at an exposure wave length of about 13.5 nm and is the most promising next generation lithographic technology for high volume manufacturing of semiconductor microelectronics with resolution less than 20 nm. EUVL is based on reflective optics and a reflective photomask including a multilayer mirror. During exposure, light reflected from portions of the photomask outside the image pattern may stray into regions which adjoin the illumination field on a target substrate onto which the image pattern is projected and which are designated for a further exposure step. Typically, a black border or shadow frame suppresses leakage of exposure light reflected at portions of the photomask outside of the imaged pattern onto an illumination field designated for a later or previous exposure step on the target substrate.

SUMMARY OF INVENTION

According to an embodiment a reflective photomask includes a substrate that includes a substrate layer of a low thermal expansion material. The substrate layer includes a main portion of a first structural configuration and an auxiliary portion of a second structural configuration of the low thermal expansion material. The auxiliary portion is formed in a frame section that surrounds a pattern section of the substrate. A multilayer mirror is formed on a first surface of the substrate. At an exposure wavelength below 15 nm a reflectivity of the multilayer mirror is at least 50%. A frame trench extends through the multilayer mirror and exposes the substrate in the frame section.

According to another embodiment a reflection-type mask blank includes a substrate that includes a substrate layer of a low thermal expansion material. The substrate layer includes a main portion of a first structural configuration and an auxiliary portion of a second structural configuration of the low thermal expansion material. The auxiliary portion is formed in a frame section that surrounds a pattern section of the substrate. A multilayer mirror is formed on a first surface of the substrate. At an exposure wavelength below 15 nm a reflectivity of the multilayer mirror is at least 50%.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2A is a schematic diagram showing a portion of a light path in a photolithographic apparatus using reflective photolithography for discussing background of the embodiments.

FIG. 3A is a schematic cross-sectional view of a frame trench in a photomask based on a homogenous substrate layer for discussing effects of the embodiments.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

Figure 1A:
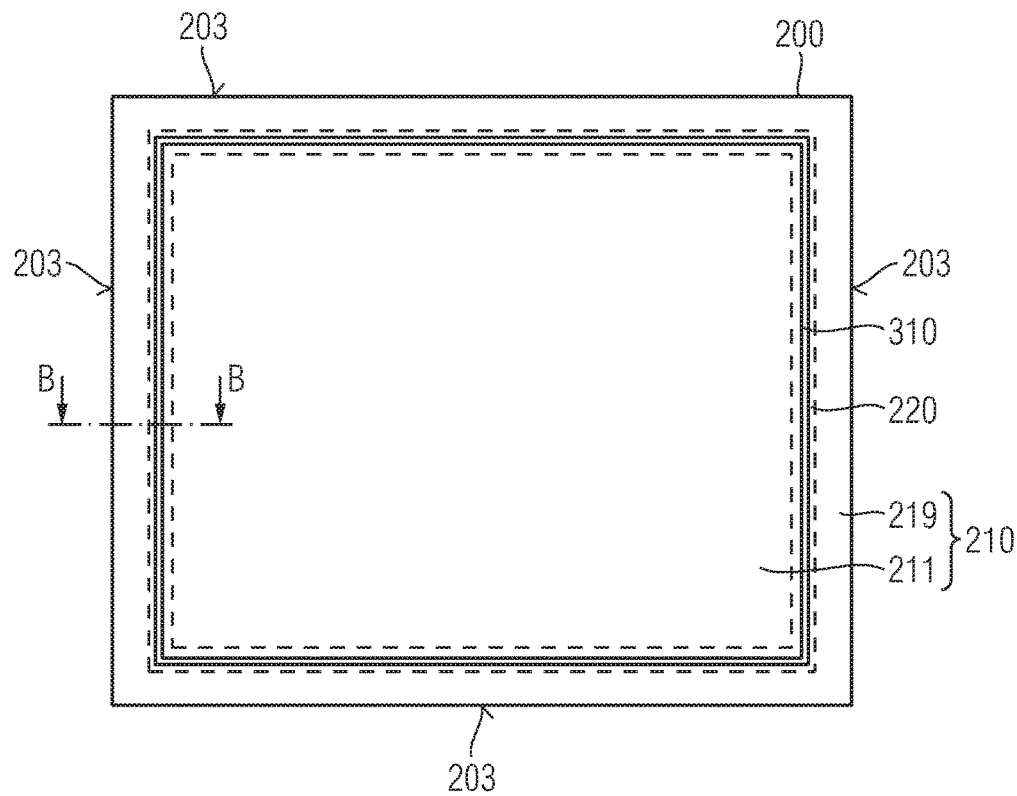
FIG. 1A is a schematic plan view of a reflective photomask with a locally modified substrate layer of low thermal expansion material according to an embodiment.
Figure 1B:
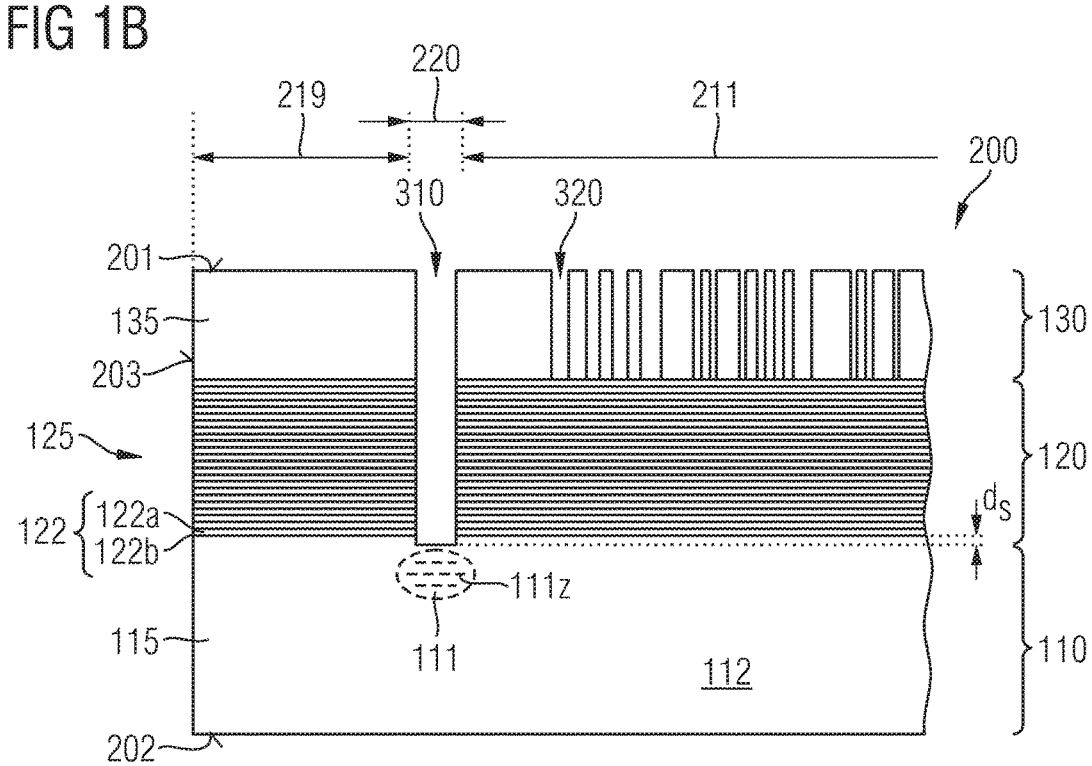
FIG. 1B is a schematic vertical cross-sectional view through a portion of the reflective photomask of FIG. 1A along line B-B.

FIGS. 1A and 1B show a reflective photomask 200 for an exposure wavelength below 15 nm, e.g., in a range from 1 nm to 15 nm. According to an embodiment, the photomask is an EUVL (extreme ultraviolet lithography) mask for an exposure wavelength in a range from 10 nm to 15 nm, e.g., about 13.5 nm, According to another embodiment, the photomask is a BEUVL (beyond extreme ultraviolet lithography) mask for an exposure wavelength in a range from 1 nm to 10 nm, e.g., about 6.7 nm.

Two parallel main surfaces 201, 202 of the photomask 200 include an exposure surface 201 onto which the exposure radiation impinges at a front side and a mounting surface 202 on the back. According to an embodiment, the photomask 200 may have a rectangular shape with an edge length of several centimeters. A direction orthogonal to the main surfaces 201, 202 is a vertical direction and directions parallel to the main surfaces 201, 202 are horizontal directions. A lateral surface 203 connects the main surfaces 201, 202.

In a view onto the exposure surface 201, a frame section 220 surrounds a pattern section 211 of the reflective photomask 200, wherein the pattern section 211 may include an image assigned to one single chip or an image assigned to a plurality of chips and an edge section 219 separates the frame section 220 from the outer lateral surface 203 of the photomask 200. According to another embodiment the photomask 200 may include a plurality of pattern sections 211, wherein each of the pattern sections 211 is assigned to one single chip and each of the pattern sections 211 is surrounded by a frame section 220.

The photomask 200 includes a substrate 110 including at least a substrate layer 115 of a low thermal expansion material (LTEM). Per definition, the low thermal expansion material has a coefficient of thermal expansion less than 1 ppm/K and may be composed of selected glass, ceramics or glass-ceramics. According to an embodiment the LTEM is a titania-silicate glass formed from or containing silicon oxide and titanium oxide, wherein the coefficient of thermal expansion is defined by +0/−10 ppb/° C. The internal structural configuration of the titania-silicate glass may be a single-phase super cooled liquid. The substrate 110 may include further layers on one or both sides of the substrate layer 115.

A reflective multilayer structure 120 covers a first surface of the substrate 110, whereas a second surface of the substrate 110 opposite to the first surface forms the mounting surface 202 of the reflective photomask 200. The reflective multilayer structure 120 may include at least a multilayer mirror 125. The multilayer mirror 125 may include at least 20, for example between 40 and 50 bi-layers 122, each bi-layer 122 including two layers 122a, 122b of material with different indices of refraction at the exposure wavelength. According to an embodiment one layer 122a of the bi-layers 122 is a silicon layer and the other layer 122b is a molybdenum layer. The different indices of reflection of silicon and molybdenum result in that the multilayer mirror 125 is effective as a Bragg reflector with a maximum of reflection typically at or close to 13.5 nm. A minimum reflectance of the reflective multilayer structure 120 at an exposure wavelength in an exposure wavelength range from 11 nm to 15 nm is at least 50%, for example more than 60%. The reflective multilayer structure 120 may include further layers on both sides of the multilayer mirror 125.

An absorber stack 130 is disposed on a surface of the reflective multilayer structure 120 opposite to the substrate 110, such that the reflective multilayer structure 120 is sandwiched between the absorber stack 130 and the substrate 110. The absorber stack 130 includes at least an absorber layer 135 with an absorbance of at least 50% at the exposure wavelength. The absorber layer 135 may be based on a metal nitride, for example, a transition metal nitride like tantalum or titanium nitride and may have a thickness of about 10 nm to about 90 nm. The absorber layer 135 may be based on tantalum nitride that may contain further main constituents, for example boron (B), to form a tantalum boron nitride (TaBN) or a material containing chromium (Cr), such as chromium nitride (CrN). The absorber stack 130 may include further layers on one or both sides of the absorber layer 135.

Within the pattern section 211 pattern trenches 320 extend from the front side through the absorber stack 130 and expose portions of the reflective multilayer structure 120. In the frame section 220 a frame trench 310 may extend from the front side through the absorber stack 130 and the reflective multilayer structure 120 down to or into the substrate 110. The frame trench 310 may extend or may not extend into the substrate 110. According to an embodiment, the frame trench 310 extends up to a depth ds of at least 50 nm, for example about 70 nm into the substrate layer 110. In the frame section 220 the substrate layer 115 includes an auxiliary portion 111, wherein the auxiliary portion 111 contains the same constituents as a remaining main portion 112 of the substrate layer 115 outside the auxiliary portion 111 but has a different structural configuration.

In the auxiliary portion 111, the reflectance of the substrate 110 in an out-of-band wavelength range outside the exposure wavelength is significantly reduced with respect to the reflectance of the main portion 112 in the same wavelength range, wherein the out-of-band wavelength range may be from 20 nm to 500 nm, for example from 100 nm to 300 nm.

The different structural configurations of the auxiliary and main portions 111, 112 results in that the auxiliary portion 111 includes scatter centres 111z scattering light in the out-of-band wavelength range. The scatter centres 111z scatter the light impinging through the frame trench 310 onto the substrate 110 arbitrarily in all directions such that less light is reflected back to the front side of the photomask 200 and onto a target substrate.

The scatter centres 111z in the auxiliary portion 111 result from a structural configuration of the low thermal expansion material of the substrate 110 locally different from the structural configuration of the low thermal expansion material in the main portion 112. According to an embodiment at least one of a crystal phase, a crystal morphology and a crystal orientation of the low thermal expansion material in the auxiliary portion 111 differs from the crystal phase, crystal morphology or crystal orientation in the main portion 112. For example, the auxiliary portion 111 may include to a higher degree crystallites or crystal grains compared to the main portion 112, which may be completely amorphous or more amorphous than the auxiliary portion 111 or the scatter centres 111z.

The scatter centres 111z may be nanoscale or microscale crystallites of silicon oxide, of titanium oxide or crystallites including both silicon and titanium atoms. According to other embodiments, the scatter centres 111z may be defects in the structure of the LTEM forming the main portion 112.

The auxiliary portion 111 including the scatter centres 111z may be formed in the vertical projection of the frame trench 310. Within the auxiliary portion 111 the scatter centres 111z may be arranged along one scatter plane or more than one parallel scatter planes spaced from each other in the vertical direction, wherein the scatter planes may be planar planes parallel to the first surface of the substrate 110 or curved planes. The vertical extension of the auxiliary portion 111 including the scatter planes may be in a typical range from 1 mm to 4 mm, for example in a range from 2.5 mm to 3 mm. A lateral extension of the auxiliary portion 111 may deviate from a width of the frame trench 310 by at most 50%, for example by at most 10%. The auxiliary portion 111 may form a continuous structure or may include several dots lined up along the frame trench 310. The auxiliary portion 111 may include several spots including scatter centres 111z, wherein a horizontal and/or vertical distance between neighbouring spots may be at least 40 µm, by way of example.

The auxiliary portion 111 may be formed directly adjoining or next to the first surface of the substrate 110 or the LTEM substrate layer 115 or along a second surface of the substrate 110 or the substrate layer 115 opposite to the reflective multilayer structure 120. According to another embodiment the scatter planes are formed in a central portion of the LTEM substrate layer 115 spaced from both the first and the second surfaces.

The scatter centers 111z are densely arranged in the frame section 220 and may form a discontinuous frame around the pattern section 211. Horizontal dimensions of a single scatter center 111z parallel to the main surfaces 201, 202 may be in a range from 0.5 µm to 2 µm, e.g., about 1 µm. A horizontal shape may be a circle, an oval, an ellipse or a rectangle with chamfered or rounded edges. A vertical extension may be in a range from 1 µm to 10 µm, e.g., about 5 µm. A mean center-to-center distance between neighboring scatter centers 111z in the same horizontal plane may be in a range from twice to 20 times, e.g., from twice to 10 times or from twice to four times the corresponding horizontal dimension.

The scatter centers 111z may be formed in the same plane or may be formed in two or more planes that may be spaced at several microns from each other. For example, neighboring scatter centers 111z may be formed in different planes, or may be formed such that sets of two or more scatter centers 111z are arranged along the same vertical axis, i.e., in the vertical projection of one another, respectively. The total power applied for forming the scatter centers 111z may be up to 2 W, and the energy per pulse may be in a range from 25 µJ to 100 µJ, e.g., about 50 µJ.

Due to the small extension and the similar composition, the auxiliary portions 111 hardly adversely affect the thermal expansion characteristics of the LTEM substrate layer 115.

Figure 2B:
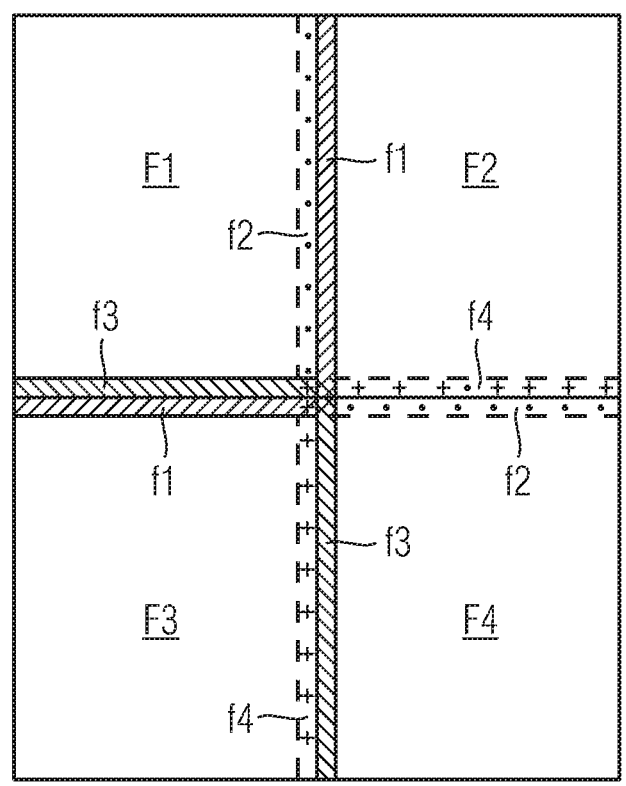
FIG. 2B is a schematic plan view of four illumination fields on a target substrate illuminated by the photolithographic apparatus of FIG. 2A for discussing background useful for understanding effects of the embodiments.
Figure 2C:
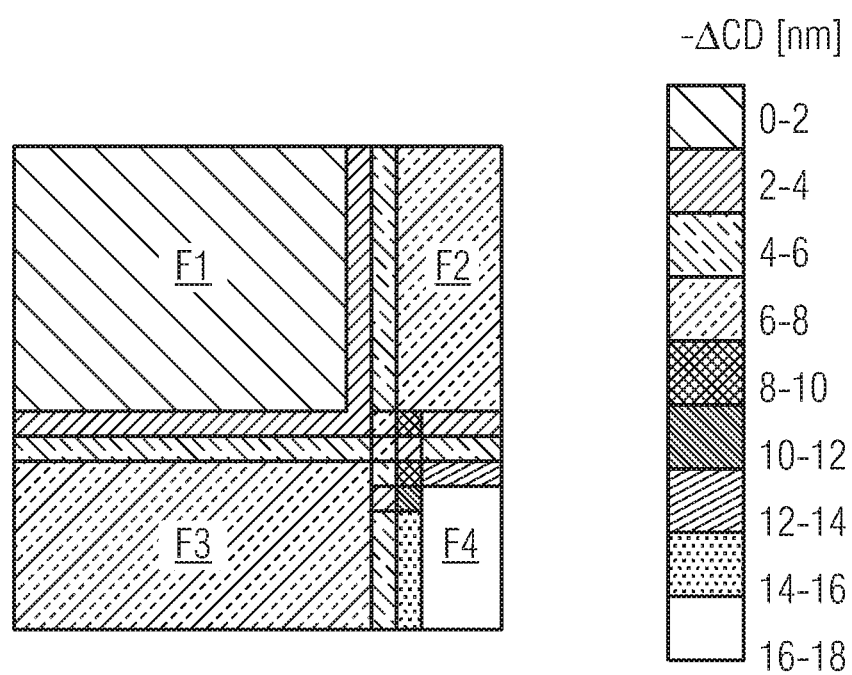
FIG. 2C is a schematic diagram illustrating the impact of stray light on the critical dimension in illumination fields illuminated by the photolithographic apparatus of FIG. 2A for discussing background useful for understanding effects of the embodiments.

FIGS. 2A to 2C show source and effects of stray light during exposure of a semiconductor wafer 600 in a photolithographic apparatus 400, e.g., an EUVL or BEUVL apparatus. A reflective optic system 410 guides exposure beam 405 to a reflective photomask 200 with a pattern section 211 and an edge section 212 surrounding the pattern section 211. The exposure beam 405 is reflected at the photomask 200 and incidents on the semiconductor wafer 600. The exposure beam 405 scans the pattern section 211 and transfers the pattern imprinted in the pattern section 211 onto a photoresist layer 601 on the semiconductor wafer 600, wherein the complete pattern section 211 is imaged into a single illumination field F1. During exposure of the first illumination field F1, a scanner may move the semiconductor wafer 600 along a horizontal direction 407 by a scanning distance which is sufficiently large such that the next illumination field F2 does not overlap with the first illumination field F1.

The photolithographic apparatus 400 may further include an aperture 420 shielding the edge region 212, which is also reflective in nature, against unused portions of the exposure beam 405. A safety margin in the alignment between the aperture 420 and the edge of the pattern section 211 and other effects may result in that stray light reflected from a portion of the edge section 212 directly adjoining the pattern section 211 impinges on the semiconductor wafer 600 in a stray light field f1, overlapping with the neighbouring illumination field F2.

FIG. 2B shows a stray light field f1 resulting from exposure of the first illumination field F1 and overlapping neighbouring illumination fields F2, F3. The width of the stray light fields f1, f2, f3, f4 resulting from exposure of the first, second, third and fourth illumination fields F1, F2, F3, F4 is in a range from 200 µm to 850 µm. Along crossing nodes, the stray light fields f2, f3, f4 of three neighbouring illumination fields may overlap with the stray light field f1 and the effects of additional stray illumination from the exposure radiation and out-of-band illumination sums up.

In a stripe pattern including parallel lines, the additional illumination results in changing of features sizes. For example, in a typical EUV resist material, for critical features the additional exposure to stray light from exposure radiation and out-of-band illumination results in a drop of the critical dimension (CD). As illustrated in FIG. 2C, for 27 nm dense lines and F4 a non imaging field, the CD drop in the resulting illumination field F2 may be 5 nm and more.

Typically, a frame trench in the reflective multilayer structure between the pattern section 211 and the edge section 212 locally reduces the reflectivity for the illumination wavelength, i.e., the actinic radiation in a narrow sense specifying a target wavelength range for which the imaging characteristic of an EUVL apparatus are specified and attenuates the effect of actinic stray light in the exposure wavelength range along the field edges.

As illustrated in FIGS. 1A to 1B, the present embodiments introduce scatter centres 111z, which are effective for an out-of-band wavelength range from 100 nm to 300 nm and which significantly decrease the reflectivity in the frame section 220 also for OOB (out-of-band) radiation in the out-of-band wavelength range outside the exposure wavelength, wherein OOB radiation is defined in a wider sense including radiation that does to some degree affect a photoresist but excluding a target wavelength range for which the imaging characteristic of an EUVL apparatus are specified. Less OOB radiation is reflected from the reflective photomask 200 in a critical region around the pattern section 220 and the total radiation in the stray light zones f1, f2, f3, f4 is significantly reduced. The source of OOB radiation may be light produced as by-product by the plasma source of the scanner.

Figure 3B:
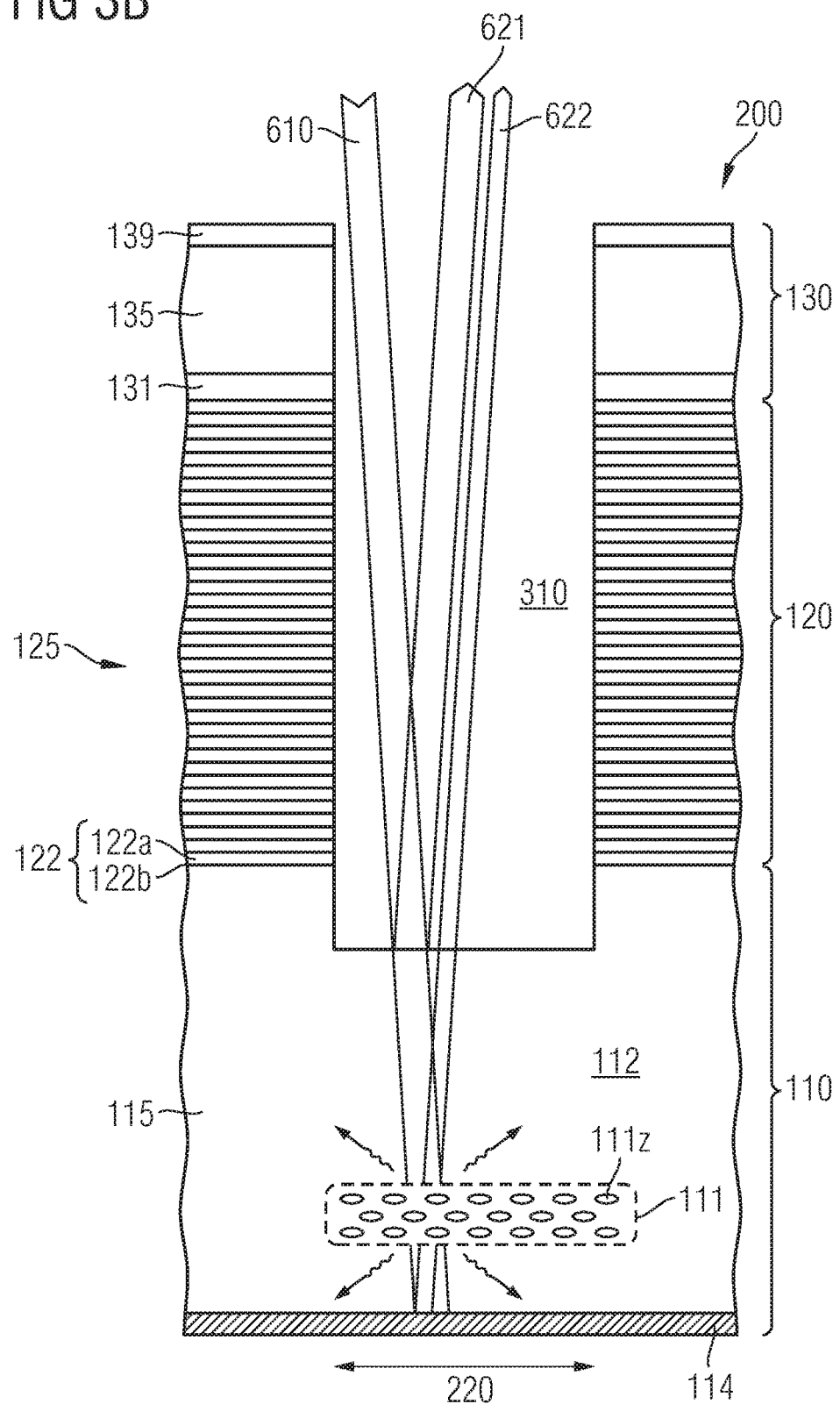
FIG. 3B is a schematic cross-sectional view of a frame trench in a photomask based on a substrate layer including scatter centres according to an embodiment.

FIGS. 3A to 3B compare reflective photomasks 200, 299 with and without scatter centres 111z in a vertical projection of a frame trench 310 in a frame section 220. In addition to the absorber layer 135, the absorber stack 130 may include an antireflective layer 139 and a buffer layer 131 as described later.

In FIG. 3A incoming OOB radiation 610 passes through a frame trench 310 of a photomask 299 without scatter centres 111z in the substrate layer 115. An air/substrate interface at the bottom of the frame trench 310 reflects a first portion 621 and a further interface on the back of the substrate layer 115 reflects a second portion 622 of the incoming OOB radiation 610. Both the first and the second portions 621, 622 may be reflected through the frame trench 310 and may incident on a target substrate outside the illumination field.

In FIG. 3B scatter centres 111z in an auxiliary portion 111 of a reflective photomask 200 according to the embodiments absorb and/or disperse the OOB radiation 610 entering the LTEM substrate layer 115 randomly in different directions such that less OOB radiation 610 reaches at the interface on the back of the substrate layer 115 in the vertical projection of the frame trench 310. The second portion 621 of reflected OOB radiation reflected at the interface on the back of the substrate layer 115 and through the frame trench 310 is significantly reduced compared to FIG. 3A.

The scatter centres 111z locally modify the effective index of refraction of the low thermal expansion material, e.g., by at least 10% without adversely affecting the thermal expansion coefficient. According to an embodiment, the scatter centres 111z are generated by short-pulsed laser radiation, e.g., at a wavelength of 532 nm, wherein the laser illumination may be performed from the front side or from the back.

Figure 4:
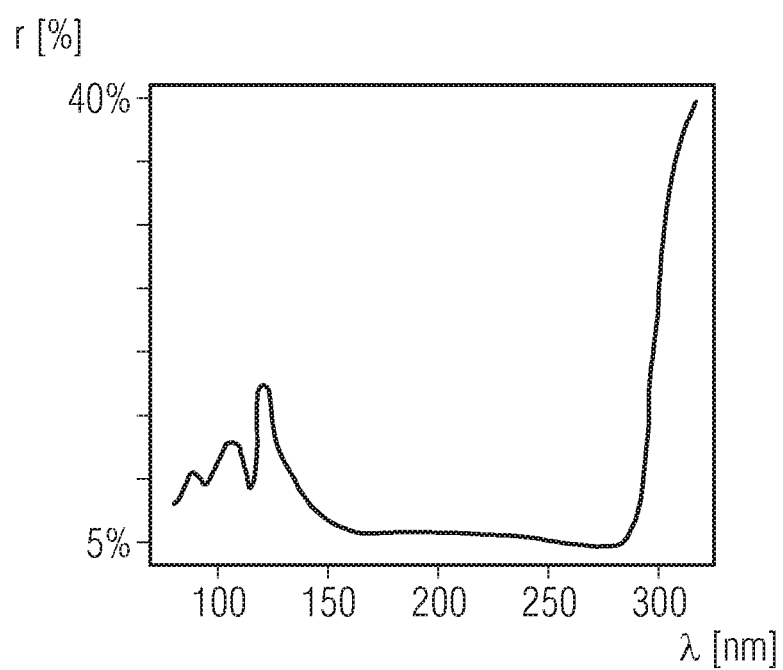
FIG. 4 is a schematic diagram showing out-of-band reflectivity of a low thermal expansion material for discussing background useful for understanding effects of the embodiments.

FIG. 4 plots the relative reflectivity against the wavelength of incident light for OOB radiation. In typical LTEM materials reflectivity shows a peak at about 120 nm and, in addition, a strong increase of reflectivity in a wavelength range from 170 nm to 300 nm. On the other hand, typical photoresists for photoresistive layers on semiconductor wafers are sensitive not only for radiation at the exposure wavelength but are also sensitive to some degree for radiation up to a wavelength of 200 or 300 nm. Suppressing out-of-band stray light therefore improves imaging quality of the photomask 200.

Figure 5A:
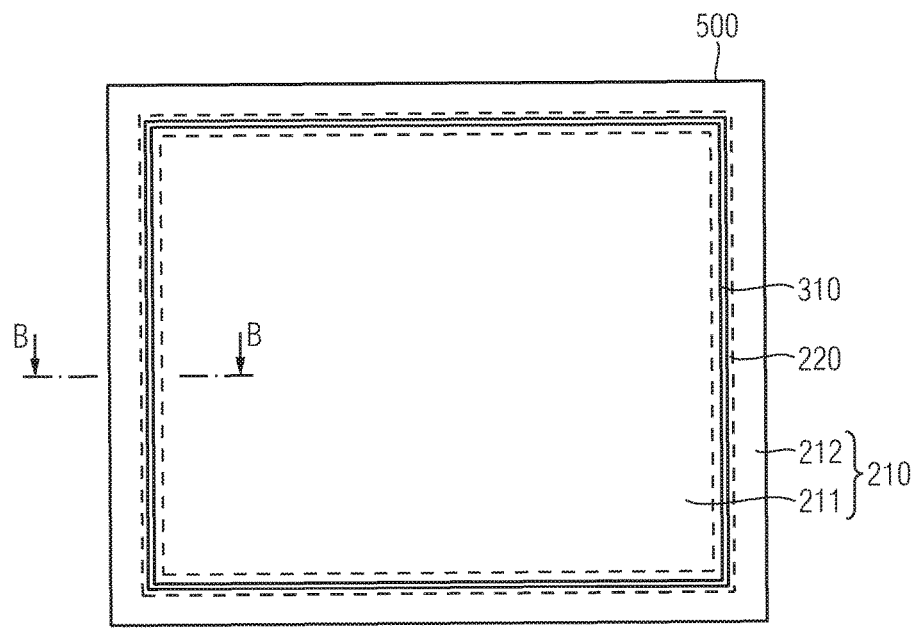
FIG. 5A is a schematic plan view of a reflective photomask with a locally modified substrate layer of low thermal expansion material and additional auxiliary layers according to another embodiment.
Figure 5B:
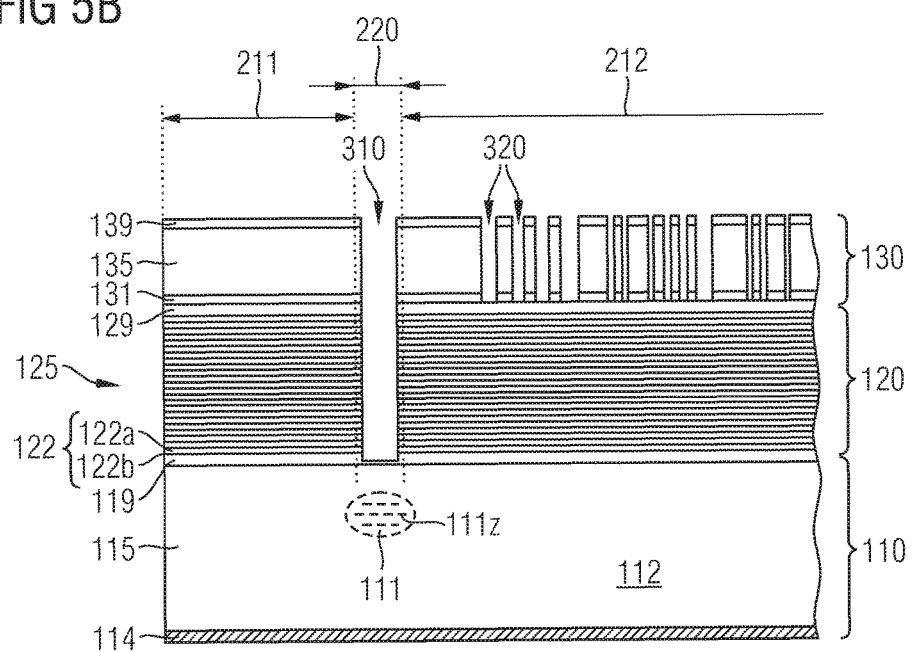
FIG. 5B is a schematic vertical cross-sectional view through a portion of the reflective photomask of FIG. 5A along line B-B.

FIGS. 5A to 5B refer to details of the photomask 200 of FIGS. 1A to 1B according to an embodiment.

In addition to the LTEM substrate layer 115, the substrate 110 may include a conductive interface layer 119 sandwiched between the reflective multilayer structure 120 and the substrate layer 115. The conductive interface layer 119 may be a metal film containing or consisting of tantalum (Ta) or chromium (Cr), by way of example. The conductive interface layer 119 may at least locally connect a portion of the multilayer mirror 125 in the pattern section 211 with the edge section 212 and may prevent a charge-up of the pattern section 211 during exposure such that the image pattern is not distorted by electrostatic charge. The frame trench 310 may extend down to an upper edge of the conductive interface layer 119, may extend into the conductive interface layer 119 and/or may partially perforate the conductive interface layer 119, wherein remnants of the conductive interface layer 119 form bridges between the pattern section 211 and the edge section 212.

The substrate 110 may further include a conductive surface film 114 on the back of the photomask 200. The conductive surface film 114 may be a thin film of a conductive material that enables electrostatic chucking of the photomask 200 at the time of exposure. For example, the conductive surface film 114 is a film of chromium nitride (CrN). According to other embodiments, the conductive surface film 114 may be a transparent conductive material, which is highly transparent against laser irradiation at a wavelength of about 532 nm, or another wavelength in a range from 190 nm to 640 nm.

In addition to the multilayer mirror 125 the reflective multilayer structure 120 may include a capping layer 129 on a side of the sequence of bi-layers 122 opposite to the substrate 110. The capping layer 129 may be a layer consisting of or containing ruthenium (Ru) and has a thickness in a range from about 2 nm to 4 nm. The capping layer 129 may protect the multilayer stack during fabrication of the absorber stack 130. According to another embodiment, the capping layer 129 may be a titanium oxide (TiO) layer.

In addition to the absorber layer 135, the absorber stack 130 may include a buffer layer 131 formed between the absorber layer 135 and the reflective multilayer structure 120. The buffer layer 131 may be effective as an etch stop layer during formation of an absorber pattern in the absorber layer 135.

At a surface of the absorber stack 130 oriented to the front side of the photomask 200, the absorber stack 130 may include an antireflective layer 139. At an inspection wavelength, which is typically longer than the EUV exposure wavelength, the anti-reflective layer 139 is less reflective than the absorber layer 135. Typically, the reflectance is less than 12% at the respective inspection wavelength. The anti-reflective layer 139 may contain or may consist of a metal nitride, for example a transition metal nitride such as titanium or tantalum nitride and may further contain one or more further components selected from a group including chlorine, fluorine, argon, hydrogen, or oxygen. The anti-reflective layer 139 may be formed by a treatment of a portion of the absorber layer 130 in an ambient containing the further component or precursors thereof. According to another embodiment, the anti-reflective layer 139 may be a silicon nitride layer or may be formed from tantalum oxide, which may contain further main constituents, for example TaBO or may be a material containing chromium, e.g. chromium oxide (CrOx).

Figure 6A:
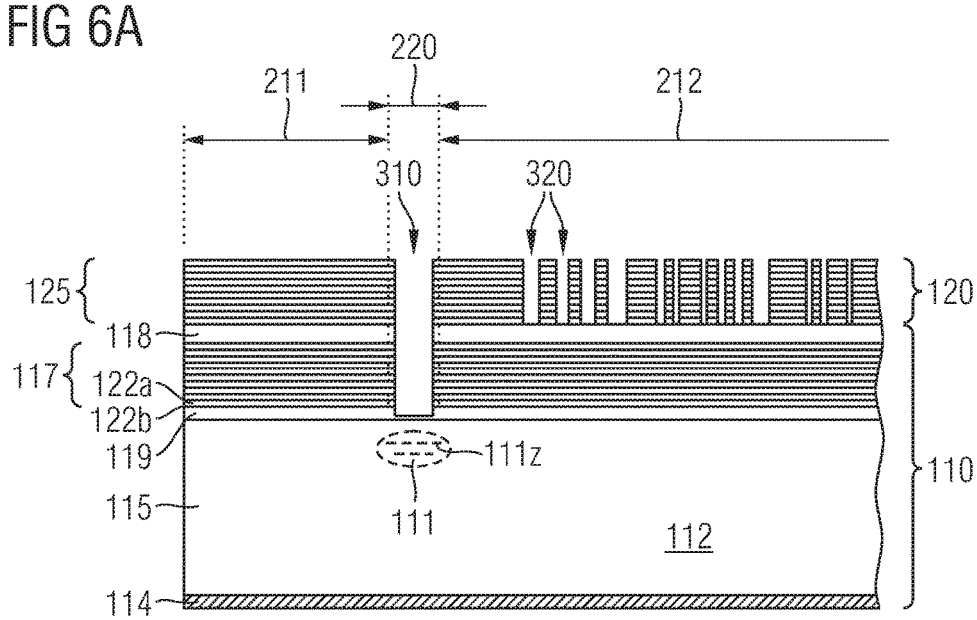
FIG. 6A is a schematic vertical cross-sectional view through a portion of a reflective photomask according to an embodiment referring to a phase shifting mask without absorber layer.
Figure 6B:
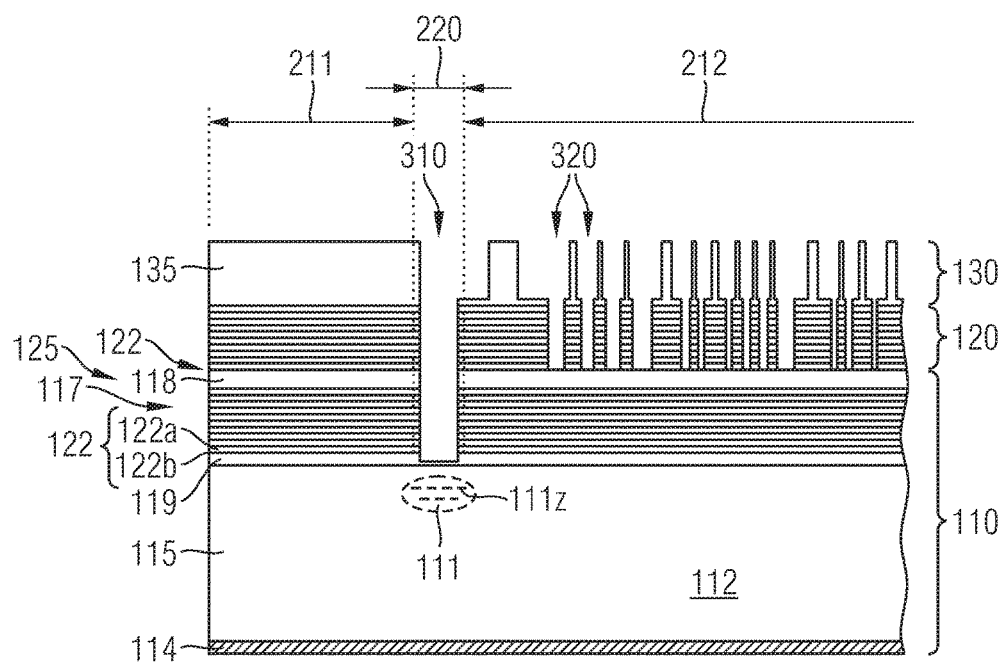
FIG. 6B is a schematic vertical cross-sectional view through a portion of a reflective photomask according to an embodiment referring to a phase shifting mask with absorber layer.

FIGS. 6A and 6B refer to reflective photomasks 200 of the phase-shifting type with the substrate 110 including a further multilayer mirror 117 with bilayers 122 as described for the multilayer mirror 125 of the reflective multilayer structure 120. The pattern trenches 320 extending through the multilayer mirror 125 of the reflective multilayer structure 120 do not extend into the further multilayer mirror 117. The substrate 110 may further include an etch stop layer 118 for ensuring that all pattern trenches 320 have the same depth and for protecting the further multilayer mirror 117 when etching the pattern trenches 320.

The photomask 200 of FIG. 6A is devoid of any absorption layer and pattern information is transferred only by the phase difference between portions of the exposure radiation reflected within multilayer mirror 125 and within further multilayer mirror 117.

In FIG. 6B the photomask 200 includes an absorber stack 130 that includes at least an absorber layer 135 in addition to the further multilayer mirror 117 within the substrate 110. For further details reference is made to the description of the previous FIGS. 5A to 5B.

Figure 7A:
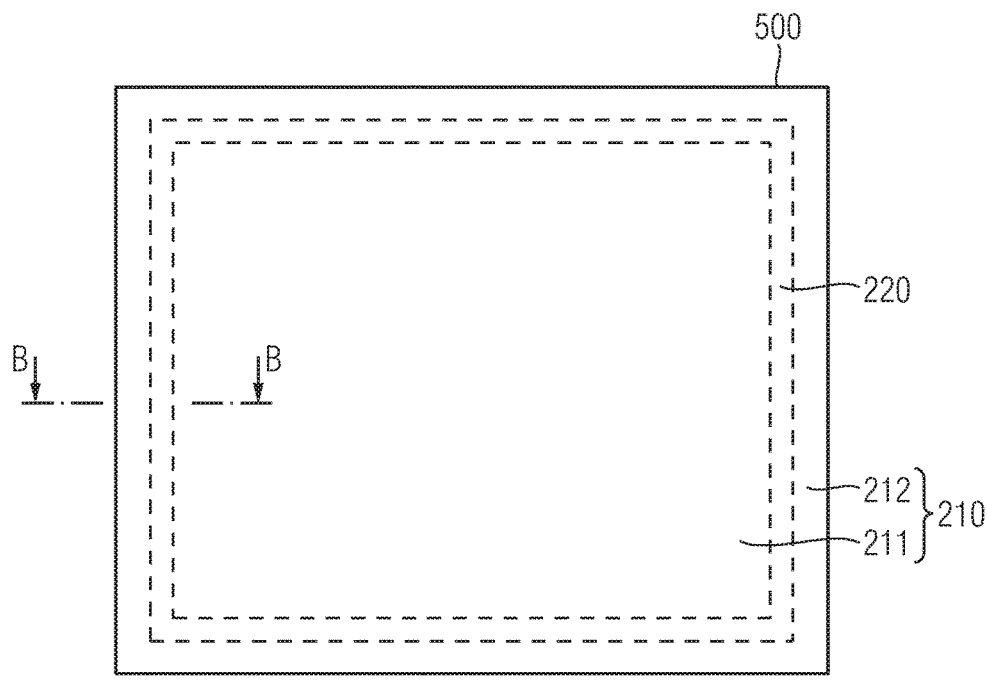
FIG. 7A is a schematic plan view of a reflection-type mask blank according to a further embodiment.
Figure 7B:
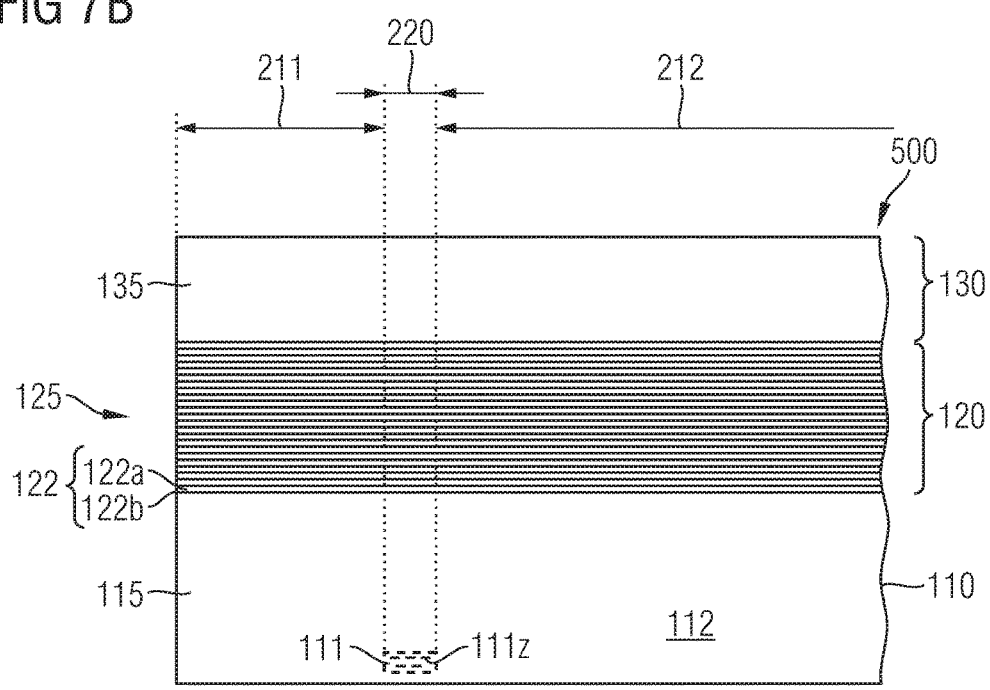
FIG. 7B is a schematic vertical cross-sectional view of a portion of the reflection-type mask blank of FIG. 7A along line B-B.

The auxiliary portion 111 may be formed after or before forming the frame trench 310 and/or the absorber pattern with the pattern trenches 320. FIGS. 7A and 7B refer to mask blanks 500 in which the scatter centres 111z are formed before the pattern trenches 320 and the frame trench 310.

The substrate 110 of the mask blank 500 includes at least a substrate layer 115 of a low thermal expansion material. A reflective multilayer structure 120 covers a first surface of the substrate 110. An absorber stack 130 is disposed on a surface of the reflective multilayer structure 120 opposite to the substrate 110 such that the reflective multilayer structure 120 is sandwiched between the absorber stack 130 and the substrate 110. The absorber stack 130 is a continuous, non-patterned structure of uniform thickness. As regards further details, reference is made to the description of the photomask 200 of FIGS. 1A to 1B.

Figure 8:
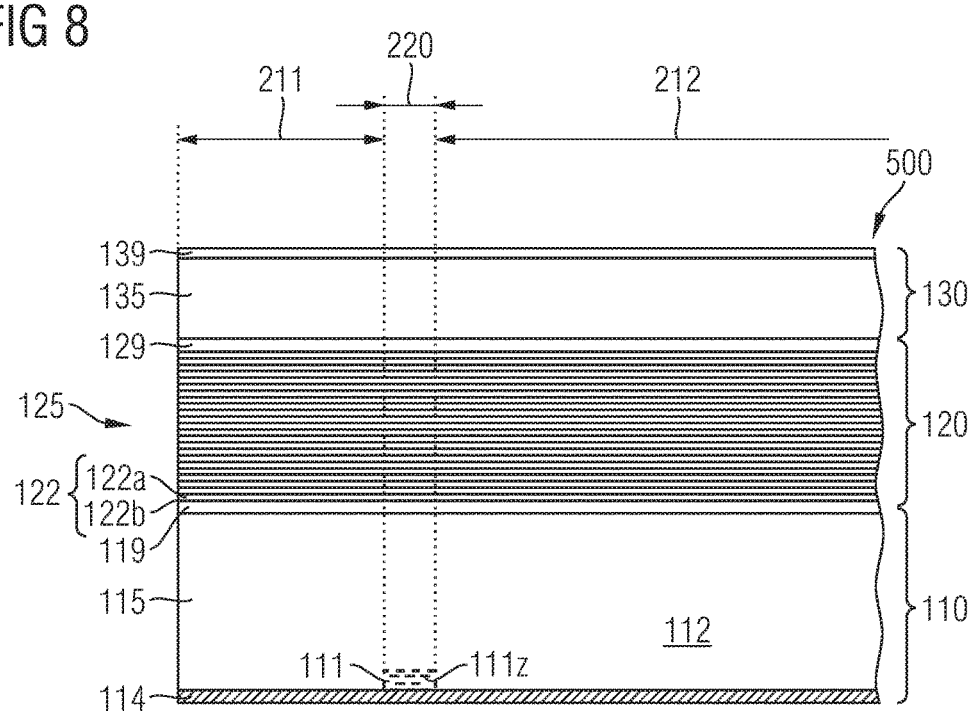
FIG. 8 is a schematic vertical cross-sectional view of a portion of a reflection-type mask blank and additional auxiliary layers according to another embodiment.

FIG. 8 shows a reflection-type mask blank 500 for the manufacture of the photomask 200 of FIGS. 5A and 5B.

Figure 9:
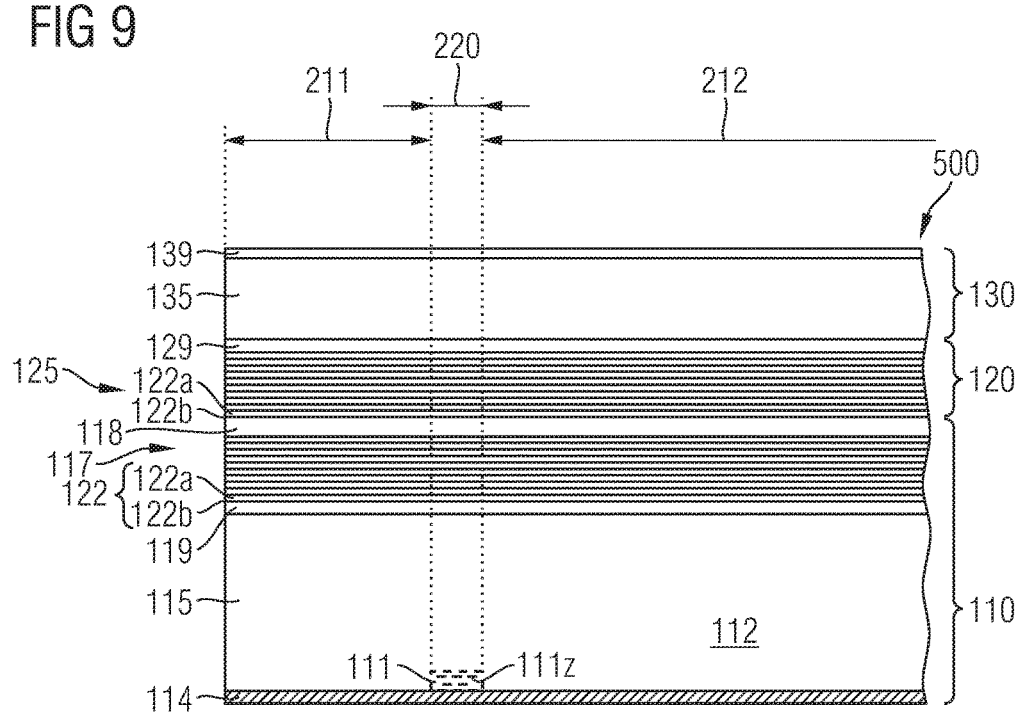
FIG. 9 is a schematic vertical cross-sectional view of a portion of a reflection-type mask blank and additional auxiliary layers according to an embodiment referring to mask blanks for phase shifting reflective photomasks.

In the reflection-type mask blank 500 of FIG. 9 the substrate 110 further includes an etch stop layer 118 sandwiched between a multilayer mirror 125 in a reflective multilayer structure 120 and a further multilayer mirror 117 in a substrate 110 for the manufacture of the photomask 200 of FIG. 6B. According to a further embodiment, the reflection-type mask blank 500 of FIG. 9 may be devoid of the absorber stack 130 for the manufacture of photomasks 200 of the type illustrated in FIG. 6A.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A reflective photomask, comprising
a substrate comprising a substrate layer of a low thermal expansion material, the substrate layer comprising a main portion of a first structural configuration and an auxiliary portion of a second structural configuration of the low thermal expansion material, wherein the auxiliary portion is formed in a frame section surrounding a pattern section of the substrate; and
a multilayer mirror formed on a first surface of the substrate, wherein at an exposure wavelength below 15 nm a reflectivity of the multilayer mirror is at least 50% and wherein a frame trench extending through the multilayer mirror exposes the substrate in the frame section.

2. The reflective photomask of claim 1, wherein
a thermal expansion coefficient of the main portion of the low thermal expansion material is less than 1 ppm/K.

3. The reflective photomask of claim 1, wherein
the auxiliary portion comprises scatter centres for radiation in an out-of-band wavelength range from 100 nm to 300 nm.

4. The reflective photomask of claim 3, wherein
in the out-of-band wavelength range a mean reflectivity of the auxiliary portion is at most 50% of a mean reflectivity in the main portion.

5. The reflective photomask of claim 1, further comprising
an absorber stack formed on the multilayer mirror opposite to the substrate, wherein an absorbance of the absorber stack at the main exposure wavelength is at least 50% and pattern trenches expose portions of the multilayer mirror in the pattern section.

6. The reflective photomask of claim 1, wherein
the frame trench forms a continuous frame surrounding the pattern section.

7. The reflective photomask of claim 1, wherein
an effective index of refraction in the frame section differs by at least 10% from an effective index of refraction in the main portion.

8. The reflective photomask of claim 1, wherein
the main portion is amorphous.

9. The reflective photomask of claim 1, wherein
the auxiliary portion is in a distance of at least 5 nm to the first surface.

10. The reflective photomask of claim 1, wherein
the auxiliary portion is formed by irradiation with laser pulses of a wavelength of 532 nm.

11. The reflective photomask of claim 1, wherein
the exposure wavelength is in a range from 6 nm to 14 nm.

12. The reflective photomask of claim 1, wherein
the auxiliary portion forms a continuous structure along the frame section.

13. The reflective photomask of claim 1, wherein
the auxiliary portion comprises isolated sections lined up along the frame section.

14. The reflective photomask of claim 1, wherein
the auxiliary portion comprises scatter centres for radiation in an out-of-band wavelength range from 100 nm to 300 nm, horizontal dimensions of a single scatter centre parallel to main surfaces are in a range from 0.5 µm to 2 µm, and a mean centre-to-centre distance between neighbouring scatter centres in the same horizontal plane is in a range from twice to twenty times the horizontal dimensions.

15. A reflection-type mask blank, comprising
a substrate comprising a substrate layer of a low thermal expansion material, the substrate layer comprising a main portion of a first structural configuration and an auxiliary portion of a second structural configuration of the low thermal expansion material, wherein the auxiliary portion is formed in a frame section surrounding a pattern section of the substrate; and
a multilayer mirror formed on a first surface of the substrate, wherein at an exposure wavelength below 15 nm a reflectivity of the multilayer mirror is at least 50%.

16. The reflection-type mask blank of claim 15, wherein
a thermal expansion coefficient of the main portion of the low thermal expansion material is less than 1 ppm/K.

17. The reflection-type mask blank of claim 15, wherein
the auxiliary portion comprises scatter centres for radiation in an out-of-band wavelength range from 100 nm to 300 nm.

18. The reflection-type mask blank of claim 17, wherein
in the out-of-band wavelength range a mean reflectivity of the auxiliary portion is at most 50% of a mean reflectivity in the main portion.

19. The reflection-type mask blank of claim 15, further comprising
an absorber stack formed on a surface of the multilayer mirror opposite to the substrate, wherein an absorbance of the absorber stack at the main exposure wavelength is at least 50%.

20. The reflection-type mask blank of claim 15, wherein
the frame section forms a continuous frame.

21. The reflection-type mask blank of claim 15, wherein
an effective index of refraction in the frame section differs by at least 10% from an effective index of refraction in the main portion.

22. The reflection-type mask blank of claim 15, wherein
the auxiliary portion forms a continuous structure along the frame section.

23. The reflection-type mask blank of claim 15, wherein
the auxiliary portion comprises isolated sections lined up along the frame section.

24. The reflection-type mask blank of claim 15, wherein the auxiliary portion comprises scatter centres for radiation in an out-of-band wavelength range from 100 nm to 300 nm, horizontal dimensions of a single scatter centre parallel to main surfaces are in a range from 0.5 µm to 2 µm, and a mean centre-to-centre distance between neighbouring scatter centres in the same horizontal plane is in a range from twice to twenty times the horizontal dimensions.

* * * * *